United States Patent
Stoll et al.

(10) Patent No.: US 6,174,232 B1
(45) Date of Patent: Jan. 16, 2001

(54) HELICALLY CONFORMING AXIAL FAN CHECK VALVE

(75) Inventors: Jason Thomas Stoll, Rochester; Maurice Francis Holahan, Lake City; Dale Lidberg, Alexandria, all of MN (US)

(73) Assignee: International Business Machines Corporation, Armonk, NY (US)

( * ) Notice: Under 35 U.S.C. 154(b), the term of this patent shall be extended for 0 days.

(21) Appl. No.: 09/390,871

(22) Filed: Sep. 7, 1999

(51) Int. Cl.[7] ....................................................... H05K 5/00
(52) U.S. Cl. ............................................. 454/184; 361/695
(58) Field of Search ...................................... 454/184, 353, 454/259; 137/843, 515.15; 251/212; 361/695

(56) References Cited

U.S. PATENT DOCUMENTS

| | | |
|---|---|---|
| 2,380,026 | 7/1945 | Clarke . |
| 2,800,967 | 7/1957 | Fogel . |
| 3,589,268 | 6/1971 | Steiner . |
| 3,638,551 | 2/1972 | Morchen et al. . |
| 4,094,336 | 6/1978 | Urschel et al. . |
| 4,470,753 | 9/1984 | Witzel . |
| 4,580,071 | 4/1986 | Nakayama . |
| 4,648,007 | 3/1987 | Garner . |
| 5,226,783 | 7/1993 | Mita . |
| 5,793,610 | 8/1998 | Schmitt et al. . |
| 5,890,959 | 4/1999 | Pettit et al. . |
| 6,017,191 * | 1/2000 | Harmsen ........................ 416/247 R |
| 6,031,717 * | 2/2000 | baddour et al. ...................... 361/687 |

FOREIGN PATENT DOCUMENTS

| | | |
|---|---|---|
| 56131865A | 10/1981 | (JP) . |
| 58150734A | 9/1983 | (JP) . |
| 5145258A | 6/1993 | (JP) . |
| 4086399A | 3/1994 | (JP) . |

OTHER PUBLICATIONS

IBM Technical Disclosure Bulletin/Fanned—Air Short—Circuit Presenter/vol. 36, No. 11, Nov. 1993.

Ibm Technical Disclosure Bulletin/"Plastic Film Fan Valve For Backflow Preventtion in Multi–Fan Plenum Cooling Systems"/vol. 38, No. 6, Jun. 1995.

* cited by examiner

Primary Examiner—Harold Joyce
Assistant Examiner—Derek S. Boles
(74) Attorney, Agent, or Firm—Felsman, Bradley, Vaden, Gunter & Dillon, LLP

(57) ABSTRACT

A fan check valve is formed from plastic film having an outer edge and a central region. The valve also has a number of slits that define flaps in the film. The flaps are symmetrically arrayed in a spiral-like pattern between the central region and the outer edge. The valve mounts to the outer surface of a tube axial fan. Under normal operating conditions, the fan moves a helical flow of air in a generally axial direction toward through the valve. The flaps are blown open and align with the oncoming flow at low angles of attack to minimize dynamic losses. The flaps are in the closed position and lie flush on the outer surface of the exhaust plate mounted on the fan at all other times to prevent airflow back through the fan in the opposite direction once the fan has failed.

27 Claims, 2 Drawing Sheets

HELICALLY CONFORMING AXIAL FAN CHECK VALVE

BACKGROUND OF THE INVENTION

1. Technical Field

This invention relates in general to cooling systems for electrical component enclosures, and in particular to an improved valve for an electrical component enclosure cooling fan.

2. Background Art

Electronic cooling systems designed for high availability or continuous operation often employ redundant fans that are arranged in parallel. This arrangement is used to guard against catastrophic loss of cooling flow in the event of a single fan device failure. One problem with this type of parallel fan configuration is that when one fan fails, the pressure difference across the surviving fan pushes air backwards through the failed fan. This reduces the delivered flow rate that would otherwise be available from the surviving fan by almost half To prevent back flow, the normal practice is to add a flap-type device on the exhaust side of the fans. Common flapper designs include swinging door flaps and multiple slat vanes. However, prior art designs neglect the inherent helical or swirling discharge pattern of tube axial exhaust fans, thereby inadvertently producing large pressure drops during normal operation of the fan before failure. It is well known tube axial fans have a discharge angle that is a direct function of the static pressure operating point on its pressure-flow curve. There is always some angle or spiral to the axial discharge direction. Indeed, the development of pressure in tube axial fans is dependent on the change in momentum brought about by changing the direction of the air. The spiral is never absent, even at free-air delivery, as velocity pressure must still be produced. The spiral always rotates in the same direction as the fan blade and appears as a helical vortex in flow visualizations. In addition, prior art designs tend to take up significant amounts of space in the axial direction that make parallel fan configurations difficult to implement in compact packages. Thus, an efficient, axially compact design for high availability exhaust fans is needed.

SUMMARY OF THE INVENTION

A fan check valve is formed from plastic film having an outer edge and a central region. The valve also has a number of slits that define flaps in the film. The flaps are symmetrically arrayed in a spiral-like pattern between the central region and the outer edge. The valve mounts to the outer surface of a tube axial fan. Under normal operating conditions, the fan moves a helical flow of air in a generally axial direction toward through the valve. The flaps are blown open and align with the oncoming flow at low angles of attack to minimize dynamic losses. The flaps are in the closed position and lie flush on the outer surface of the exhaust plate mounted on the fan at all other times to prevent airflow back through the fan in the opposite direction once the fan has failed.

BRIEF DESCRIPTION OF THE DRAWINGS

So that the manner in which the features, advantages and objects of the invention, as well as others which will become apparent, are attained and can be understood in more detail, more particular description of the invention briefly summarized above may be had by reference to the embodiment thereof which is illustrated in the appended drawings, which drawings form a part of this specification. It is to be noted, however, that the drawings illustrate only a preferred embodiment of the invention and is therefore not to be considered limiting of its scope as the invention may admit to other equally effective embodiments.

BEST MODE FOR CARRYING OUT THE INVENTION

Figure 1:
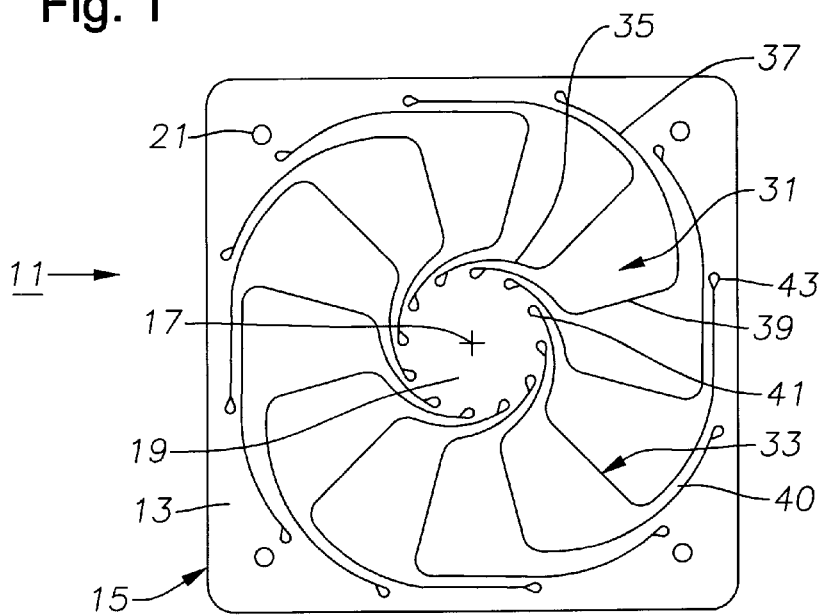
FIG. 1 is a plan view of a exhaust fan valve constructed in accordance with the invention.

Referring to FIG. 1, a fan valve 11 is formed from a thin, flat substrate or flexible plastic film 13 with an outer edge or perimeter 15, a center point 17, and a generally circular, radially inward or central region 19. In the preferred embodiment, film 13 is formed from a resilient polyethylene such as DuPont's MYLAR®. In the embodiment shown, film 13 has a thickness of approximately 0.15 mm and has a permanent pressure sensitive acrylic adhesive layer or the like (not shown) along the outer edge portions of its rear surface for facilitating mounting to a fan. The rear surface of the central region 19 may also be coated with the adhesive. A releasable liner (not shown) is provided for covering the adhesive areas prior to use. Film 13 also has a mounting hole 21 at or near each of its corners.

Valve 11 also has a plurality of generally C-shaped flaps 31 formed in film 13. Flaps 31 are symmetrically arrayed in a spiral-like pattern about the center point 17. In the preferred embodiment, valve 11 has in the range of ten to twelve flaps 31. Each flap 31 is defined by a single, continuous nonlinear slit 33 that extends between the central region 19 and perimeter 15 of film 13. Slits 33 are die or laser cuts that are approximately 1.5 mm wide.

Each slit 33 comprises an arcuate, radially inward segment 35, an arcuate, radially outward segment 37, and a linear segment 39 therebetween. Linear segment 39 defines an upstream edge 39a (FIG. 3) for one flap 31, and a downstream edge 39b for the flap 31 that is immediately counterclockwise to it. The arcuate portions of outer segments 37 have a larger radius than the arcuate inner segments and different center points. Note the inner segments 35 spiral away from central region 19 in the clockwise direction and somewhat overlap one another radially. This creates a thin, arcuate inner leg 38 for each flap 31. Outer segments 37 spiral outward in the counterclockwise direction and overlap one another near perimeter 15. This creates an arcuate outer leg 40 for each segment 31. The clearances between adjacent ones of the inner segments 35 and adjacent ones of the outer segments 37 are approximately 3.0 mm, providing inner legs 38 and outer legs 40 with widths of about 3.0 mm. Valve 11 may be inverted such that the spiral directions of slits 33 are reversed.

The shapes of inner segments 35 are substantially uniform and arcuate. Linear segments 39 are also substantially uniform and radiate on a radial line from center point 17. However, the shapes of outer segments 37 are not substantially uniform. The four outer segments 37 near the four corners of film 13 are substantially arcuate. The remaining outer segments 37 have both a linear portion and a arcuate portion as shown, and are slightly longer than the four outer segments 37 in the corners. Alternatively, slits 33 may be formed such that they are perfectly symmetrical in all segments. In addition, the interfaces between segments 35, 37 and their respective linear segments 39 are radiused so that slits 33 have no sharp corners. Each slit 33 has a radially inward end 41 and a radially outward end 43. Ends 41, 43 are formed with large radii in order to reduce fatigue stress concentrations in film 13.

Figure 2:
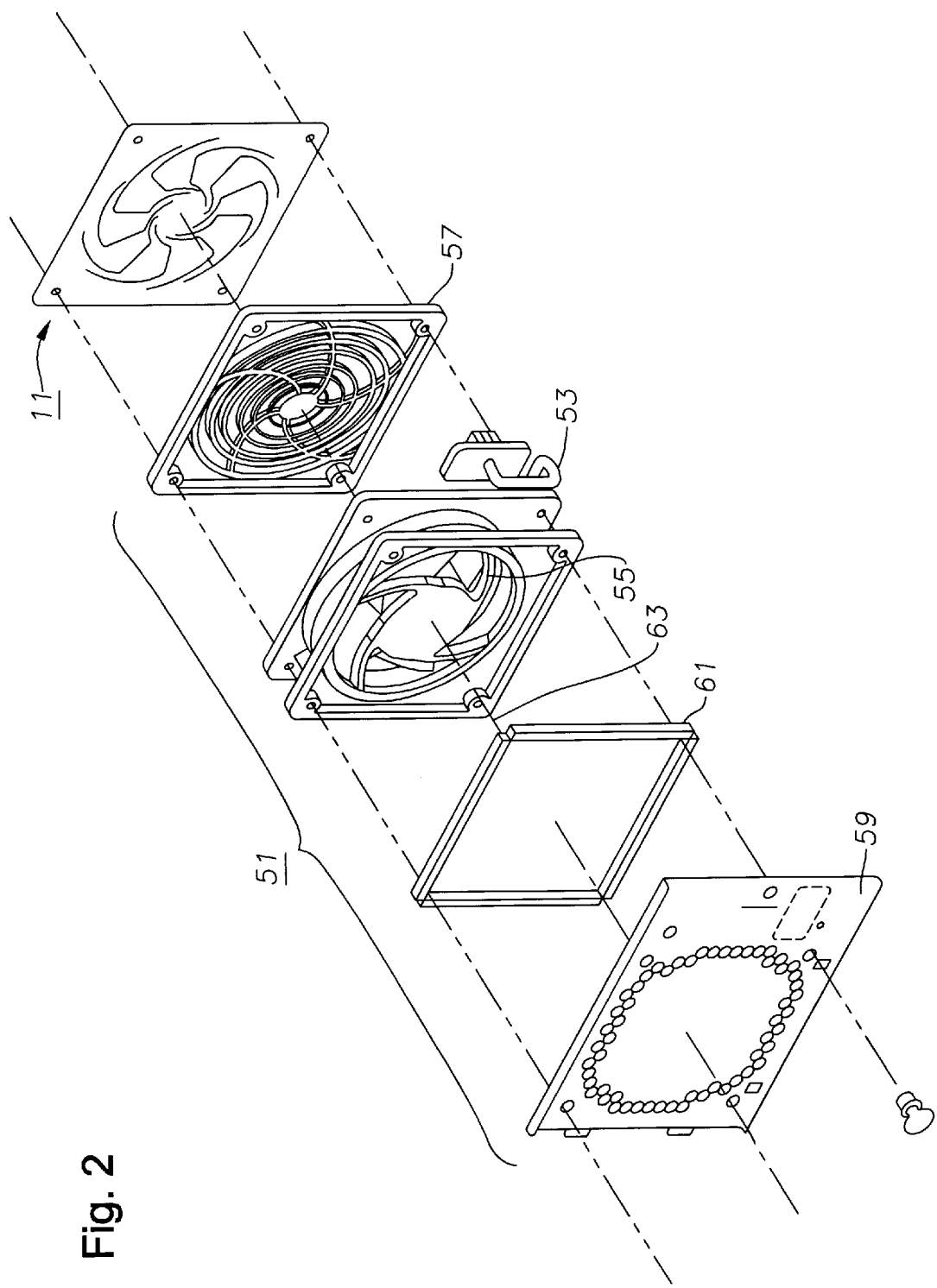
FIG. 2 is a rear isometric exploded view of a tube axial exhaust fan and the valve of FIG. 1.

Valve 11 mounts to a fan such as the tube axial fan 51 shown in FIG. 2. Fan 51 is typically used in parallel with other fans to circulate air and cool electrical components inside an enclosure (not shown). In the embodiment shown, fan 51 comprises a fan motor 53 with an impeller 55, a grill or cover 57, a back plate 59, an optional foam seal 61 between motor 53 and back plate 59, and a longitudinal axis 63. The adhesive coating on the rear surface of film 13 bonds to the axial front face of cover 57. In addition, fasteners (not shown) may be used to secure valve 11 to fan 51.

Figure 3:
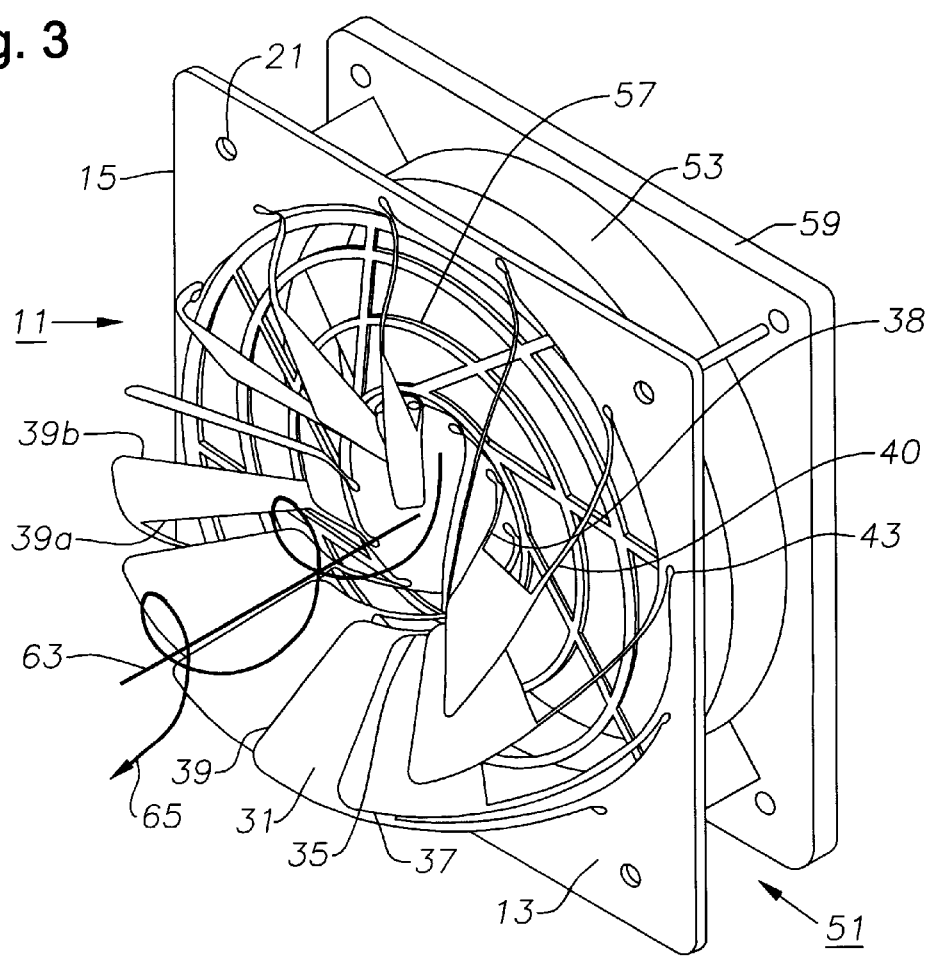
FIG. 3 is a front isometric view of the valve of FIGS. 1 and 2 installed on the exhaust fan of FIG. 2.

In normal operation (FIG. 3), motor 53 of fan 51 moves a helical flow of air 65 in a generally axial direction toward valve 11. As fan 51 circulates the air 65, flaps 31 are blown to their open position (FIG. 3). In the open position, flaps 31 move axially away from cover 57 in a generally circular pattern. The two ends 41, 43 of each slit 33 act as inner and outer hinges, respectively, for each flap 31. The length and thickness of inner and outer legs 38, 40 are such that they allow flaps 31 to align with the oncoming vortex flow at low angles of attack. This is critical to the minimization of dynamic losses from vortex shedding that occurs at higher angles of attack, as is typically present with traditional pivoting vane designs.

When in the operational position, flaps 31 align in a pattern that is similar to the blades of an axial flow fan. The upstream edge 39*a* (FIG. 3) is closer to the fan 5 than the downstream edge 39*b*. The inner and outer legs 38, 40 flex downstream and clockwise. The longer length of outer leg 40 results in outer segments 37 being further downstream than inner segments 35. The low spring force presented by the hinges and legs 38, 40 prevents flow-induced vibration of flaps 31. Flaps 31 are in the closed position (FIGS. 1 and 2) and lie flush on the face of cover 57 at all other times to prevent airflow back through fan 51 in the opposite direction.

The invention has several advantages. The valve disclosed herein is a simple, inexpensive design that requires much less axial space than those of the prior art. The flaps on the valve are designed to conform to the helical discharge pattern of tube axial fans while preventing backflow in the event of fan failure or loss of power. This configuration minimizes drag and energy loss for axial fans. The valve also achieves high availability and reliability while being able to function in any orientation. It is unaffected by gravity.

Since the valve prevents reverse flow, it prevents the fan from "windmilling" in the reverse direction. Some air moving device motors will not restart if they are windmilling in the reverse direction. These systems would require shutdown of all fans if a backflow condition developed. Use of the invention would enable re-start without having to shut down the entire system. In addition, the device operates independently of fluid density and may be used more broadly in other applications of axially impelled fluids needing protection from backflow, such as water pumps. The valve can also eliminate the need for expensive control circuitry for detection of fan failure or multi-speed fan designs. It does not adversely affect fan delivery in normal operation and allows a lower acoustic level during operation.

While the invention has been shown or described in only some of its forms, it should be apparent to those skilled in the art that it is not so limited, but is susceptible to various changes without departing from the scope of the invention.

We claim:

1. A check valve for a fan having a rotary axis and a grid that is substantially perpendicular to the axis, comprising:

a resilient substrate adapted to be mounted to the grid of the fan, the substrate having a center point, a radially inward region and a perimeter;

a plurality of flaps formed in the substrate, each of the flaps being defined by a slit having a radial edge segment with inner and outer ends extending from the inward region of the substrate toward the perimeter, and an outer edge segment extending transversely from the outer end of the radial edge segment; and wherein the valve moves to an open position due to air pressure from the fan wherein the flaps flex axially away from the grid, and a closed position when air pressure from the fan ceases wherein the flaps are adapted to lie flush on the grid of the fan to prevent reverse airflow through the fan.

2. The valve of claim 1 wherein the flaps are arrayed in a spiral-like pattern about the center point, with the radial edge segments being generally on radial lines from the center point.

3. The valve of claim 1 wherein each of the slits further has an inner edge segment extending transversely from the inner end of the radial edge segment.

4. The valve of claim 1 wherein the outer edge segment of each of the slits extends counterclockwise from the outer end of the radial edge segment, when viewing the valve from a downstream side.

5. The valve of claim 3 wherein the inner and outer edge segments of each of the slits extend counterclockwise from the inner and outer ends, respectively, of the radial edge segment, as viewed from a downstream side of the valve.

6. The valve of claim 1, further comprising a pressure sensitive adhesive backing on the substrate for facilitating mounting to the grid of the fan.

7. The valve of claim 3 wherein the radial edge segment is straight, and the inner and outer edge segments are arcuate.

8. The valve of claim 5 wherein the inner and outer edge segments of each slit have ends that terminate counterclockwise from the radial edge segment of an adjacent one of the slits, overlapping the inner and outer edge segments of said adjacent one of the slits to define inner and outer legs for each of the flaps.

9. The valve of claim 8 wherein the inner and outer legs are dimensioned so that while in the open position, each flap will have upstream and downstream edges that are interconnected by inner and outer edges, the outer edges of the flaps being further downstream than the respective inner edges of the flaps.

10. The valve of claim 9 wherein, while in the open position, the upstream and downstream edges are adapted to incline away from the grid of the fan.

11. The valve of claim 1 wherein the substrate is formed from plastic film.

12. A check valve for an axial flow exhaust fan, comprising:

a thin, resilient substrate adapted to be mounted to the fan, the substrate having a center point, a radially inward region and a perimeter;

a plurality of slits formed in the substrate defining apertures and arranged to create flaps that flex downstream while the fan discharges air against the substrate to allow the air to pass through the fan, the flaps being in a spiral array about the center point; and wherein the resiliency of the substrate causes the flaps to flex back to close the apertures when the fan ceases to operate.

13. The valve of claim 12 wherein the slits have radial edge segments extending along radial lines from the center point, and an inner edge segment extending transversely from an inner end of the radial edge segment.

14. The valve of claim 13 wherein each of the slits has an outer edge segment that extends counterclockwise from an outer end of the radial edge segment, when viewing the valve from a downstream side.

15. The valve of claim 14 wherein the inner and outer edge segments of each of the slits extend counterclockwise from the inner and outer ends, respectively, of the radial edge segment, as viewed from a downstream side of the valve.

16. The valve of claim 12, further comprising a pressure sensitive adhesive backing on the substrate for facilitating mounting to the fan.

17. The valve of claim 14 wherein the radial edge segment is straight, and the inner and outer edge segments are arcuate.

18. The valve of claim 15 wherein the inner and outer edge segments of each slit have ends that terminate counterclockwise from the radial edge segment of an adjacent one of the slits, overlapping the inner and outer edge segments of said adjacent one of the slits to define inner and outer legs for each of the flaps.

19. The valve of claim 18 wherein the inner and outer legs are dimensioned so that while in the open position, each flap will have upstream and downstream edges that are interconnected by inner and outer edges, the outer edges of the flaps being further downstream than the respective inner edges of the flaps.

20. The valve of claim 19 wherein, while in the open position, the upstream and downstream edges are adapted to incline away from the fan.

21. The valve of claim 12 wherein the substrate is formed from plastic film.

22. A check valve for a fan having a rotary axis and a grid that is substantially perpendicular to the axis, comprising:

a resilient substrate adapted to be mounted to the grid of the fan, the substrate having a center point, a radially inward region and a perimeter;

a plurality of flaps formed in the substrate and arrayed in a spiral-like pattern about the center point, each of the flaps being defined by a slit; each of the slits having a radial edge segment extending generally on radial lines from the center point and having inner and outer ends extending from the inward region of the substrate toward the perimeter;

an inner edge segment extending transversely from the inner end of the radial edge segment;

an outer edge segment extending transversely from the outer end of the radial edge segment, the inner and outer edge segments of each slit having ends that terminate counterclockwise from an adjacent radial edge segment, overlapping the inner and outer edge segments of said adjacent radial edge segment to define inner and outer legs for each of the flaps; wherein the valve moves to an open position due to air pressure from the fan wherein the flaps flex axially away from the grid, and a closed position when air pressure from the fan ceases wherein the flaps are adapted to lie flush on the grid of the fan to prevent reverse airflow through the fan; and wherein the inner and outer legs are dimensioned so that while in the open position, each flap will have upstream and downstream edges that are interconnected by inner and outer edges, wherein the upstream and downstream edges are adapted to incline away from the fan, and the outer edges of the flaps are further downstream than the respective inner edges of the flaps.

23. The valve of claim 22 wherein the outer edge segment of each of the slits extends counterclockwise from the outer end of the radial edge segment, when viewing the valve from a downstream side.

24. The valve of claim 22 wherein the inner and outer edge segments of each of the slits extend counterclockwise from the inner and outer ends, respectively, of the radial edge segment, as viewed from a downstream side of the valve.

25. The valve of claim 22, further comprising a pressure sensitive adhesive backing on the substrate for facilitating mounting to the grid of the fan.

26. The valve of claim 22 wherein the radial edge segment is straight, and the inner and outer edge segments are arcuate.

27. The valve of claim 22 wherein the substrate is formed from plastic film.

* * * * *